United States Patent [19]

Laws et al.

[11] Patent Number: 4,646,298
[45] Date of Patent: Feb. 24, 1987

[54] SELF TESTING DATA PROCESSING SYSTEM WITH SYSTEM TEST MASTER ARBITRATION

[75] Inventors: Gerald E. Laws; Keith E. Diefendorff, both of Austin, Tex.

[73] Assignee: Texas Instruments Incorporated, Dallas, Tex.

[21] Appl. No.: 605,751

[22] Filed: May 1, 1984

[51] Int. Cl.[4] .............................................. G06F 11/00
[52] U.S. Cl. ...................................... 371/16; 364/200; 371/20
[58] Field of Search ................ 371/16, 20; 364/200, 364/900

[56] References Cited

U.S. PATENT DOCUMENTS

| | | | |
|---|---|---|---|
| 3,623,011 | 11/1971 | Baynard, Jr. et al. | 364/200 |
| 4,014,005 | 3/1977 | Fox et al. | 364/200 |
| 4,108,358 | 8/1978 | Niemaszyk et al. | 371/20 |
| 4,251,861 | 2/1981 | Mago | 364/200 |
| 4,312,066 | 1/1982 | Bantz et al. | 371/16 |
| 4,354,225 | 10/1982 | Frieder et al. | 364/200 |
| 4,371,952 | 2/1983 | Schuck | 364/900 |

*Primary Examiner*—Charles E. Atkinson
*Attorney, Agent, or Firm*—Kenneth C. Hill; James T. Comfort; Melvin Sharp

[57] ABSTRACT

The present invention relates to a self testing data processing system which includes a communications bus enabling communication between nonintelligent data processing circuits and a plurality of intelligent data processing circuits. The communications bus has connection slots, each connection slot having a unique electrically readable slot number. Each data processing circuit connects to the communications bus via one of the connection slots. Each data processing circuit has an identity memory which indicates whether or not that circuit can be a system test master. In addition, all intelligent data processing circuits include within their identity memory an indication of whether or not they have passed a circuit self test. Upon initial application of electric power or upon system reset, each intelligent data processing circuit performs a circuit self test and then sets the identity memory to indicate whether or not they have passed this self test. The intelligent data processing circuits then arbitrate to determine which circuit is to become the system test master. If an intelligent data processing circuit has failed its circuit self test or if it determines that an intelligent data processing circuit in a lower slot number has passed its own self test, then that intelligent data processing circuit defers system test control. The remaining intelligent data processing circuit, which has not deferred system test control, then takes control of the data processing system testing including testing of the nonintelligent data processing circuits.

21 Claims, 6 Drawing Figures

SELF TESTING DATA PROCESSING SYSTEM WITH SYSTEM TEST MASTER ARBITRATION

BACKGROUND OF THE INVENTION

The present invention relates to self testing in a complex data processing system such as a multiprocessor computer system. It is typical within such complex data processing systems to provide a measure of self testing in order to enable quick detection and location of any faults within the data processing system. It is typical within such self testing systems to provide a self test program written in the native language of the central processing unit of the computer. This central processing unit then recalls and executes this program in order to provide the test functions.

There are several design trends which make continued reliance upon this single test program written in the native code of the single processing unit disadvantageous. Firstly, the construction of such computer systems is becoming increasingly modular. That is, a base system is provided having a number of slots for receiving plug-in circuit boards. Then the user assembles a system by selecting a desired set of plug-in circuit boards from among a selection of differing types of circuit boards. This type of construction puts a design constraint on the individual circuit boards that they may operate in a variety of differing configurations with differing additional circuit boards. In addition, it is considered convenient for the user to be able to insert any board within any one of the plug-in slots. Secondly, a further design trend is toward the use of more than one processor unit. Multiprocessor systems are employed to provide greater computing power through concurrent processing or through special purpose processing. Although microprocessor units do come in "families" which share the same native language, it is often desirable to include microprocessors in a single system from differing "families". In such a case, in accordance with the prior art, it is necessary to choose a single microprocessor native language and write the data processing test program in that language. This situation is considered less than ideal because, although an additional microprocessor may be available even when the primary microprocessor fails, it is not possible for the secondary microprocessors which do not execute the native code in which the test program is written to perform these system tests. Thus, while processing capability is available to both perform these tests and perhaps to perform some normal operating functions, the system is inoperable due to the incompatibility of the native languages of the microprocessors.

In many such complex data processing systems, there will be at least some circuit boards which cannot perform their own self test. Such things as random access memory boards are not normally provided with self test capability. It would be advantageous to provide on such nonintelligent data processing circuits a program for testing this circuit board which can be executed by an intelligent data processing circuit elsewhere in the system. In a computer system which is modular and permits microprocessors with differing native languages, in accordance with the prior art, a design choice must be made as to which native language to employ in the test program for this nonintelligent data processing circuit. Alternately, the test program may be provided in each of the native languages of the permitted microprocessors of the system. Either of these choices includes the possibility of enabling a new microprocessor having a differing native language to run the tests of prior nonintelligent circuits.

SUMMARY OF THE INVENTION

The present invention is a self testing data processing system in which any surviving intelligent data processing circuit can perform the system test. This self testing data processing system comprises a communications bus with a plurality of slots for insertion of data processing circuits, at least one nonintelligent data processing circuit and a plurality of intelligent data processing circuits.

Each slot in the communications bus has an electrically readable slot number which provides each board with a unique identifier which is dependent upon the slot to which that board is connected. Each data processing circuit, including both the nonintelligent and the intelligent circuits, has an identity memory which is readable from the communications bus and which indicates whether or not that circuit can become a system test master. The intelligent data processing circuits have further data in this identity memory indicating whether or not the intelligent data processing circuit has passed a circuit self test.

The self testing of the data processing system of the present invention occurs in three steps. Firstly, all intelligent data processing circuits perform a circuit self test upon initial application of electric power or upon a system reset command. This circuit self test is performed concurrently by each intelligent data processing circuit based upon a self test program stored on that circuit. This self test must be designed to avoid any requirement for communication to circuits outside of itself. Upon completion of the circuit self test, each intelligent data processing circuit sets data within an identity memory to indicate whether or not that circuit has passed its own circuit self test.

In the second phase of the self test system, a system test master is selected by arbitration. Each intelligent data processing circuit which passes its own circuit self test may take part in this arbitration. Each such passing intelligent data processing circuit reads from the identity memory of other slots. This process is enabled because each slot has a unique slot number enabling any intelligent data processing circuit access to the identity memory of any other slot via a read memory command. At this time each intelligent data processing circuit tests to determine whether or not another intelligent data processing circuit which inhibits a lower slot number has passed its own circuit self test. Each intelligent data processing circuit defers system test control if it either fails its own circuit self test or if it determines that another intelligent data processing circuit has both passed its own circuit self test and inhibits a lower slot number.

In the third step, a single intelligent data processing circuit becomes the system test master. This system test master is the intelligent data processing circuit which has passed its circuit self test and which inhibits the lowest slot number. The master arbitration scheme requires each of the other intelligent data processing circuits to defer to this intelligent data processing circuit. This system test master then performs a system test. This system test may include tests of the nonintelligent data processing circuit as well as tests of communications between various circuits of differing types.

In the preferred embodiment of the present invention, the identity memory of each data processing circuit has an address fixed by the slot number. This is achieved because all the circuits have the same least significant bits for the identity memory and have the most significant bits determined by the slot number. Then any identity memory may be read from the communications bus via a read command which specifies the address corresponding to the identity memory for that slot.

In a further preferred embodiment, each intelligent data processing circuit also indicates to the communication bus via its identity memory whether or not its circuit self test is in progress. Any intelligent data processing circuit which attempts to determine whether or not this circuit has passed its own circuit self test must also read this test in progress indication and defer decisions while the circuit self test is in progress. However, each intelligent data processing circuit must have a time out feature so that it determines that another intelligent data processing circuit has failed if the self test of that circuit is in progress for longer than a predetermined period of time. In a further improved embodiment, each circuit has as a part of its identity memory an indication of how long it requires to execute its own circuit self test. Thus, any other intelligent data processing circuit would not judge that that circuit had failed until at least this test duration period of time has elapsed.

BRIEF DESCRIPTION OF THE DRAWINGS

These and other objects of the present invention will become apparent from the following detailed description of the invention taken in conjunction with the drawings in which.

DETAILED DESCRIPTION OF THE PREFERRED EMBODIMENT

The invention will now be described in detail in association with the drawings of FIGS. 1 to 5A/5B. It should be understood that the particular structures illustrated and described are intended merely to be illustrative of the invention and are not to be construed to limit the invention. The limitations on the invention are detailed in the attached claims.

Figure 1:
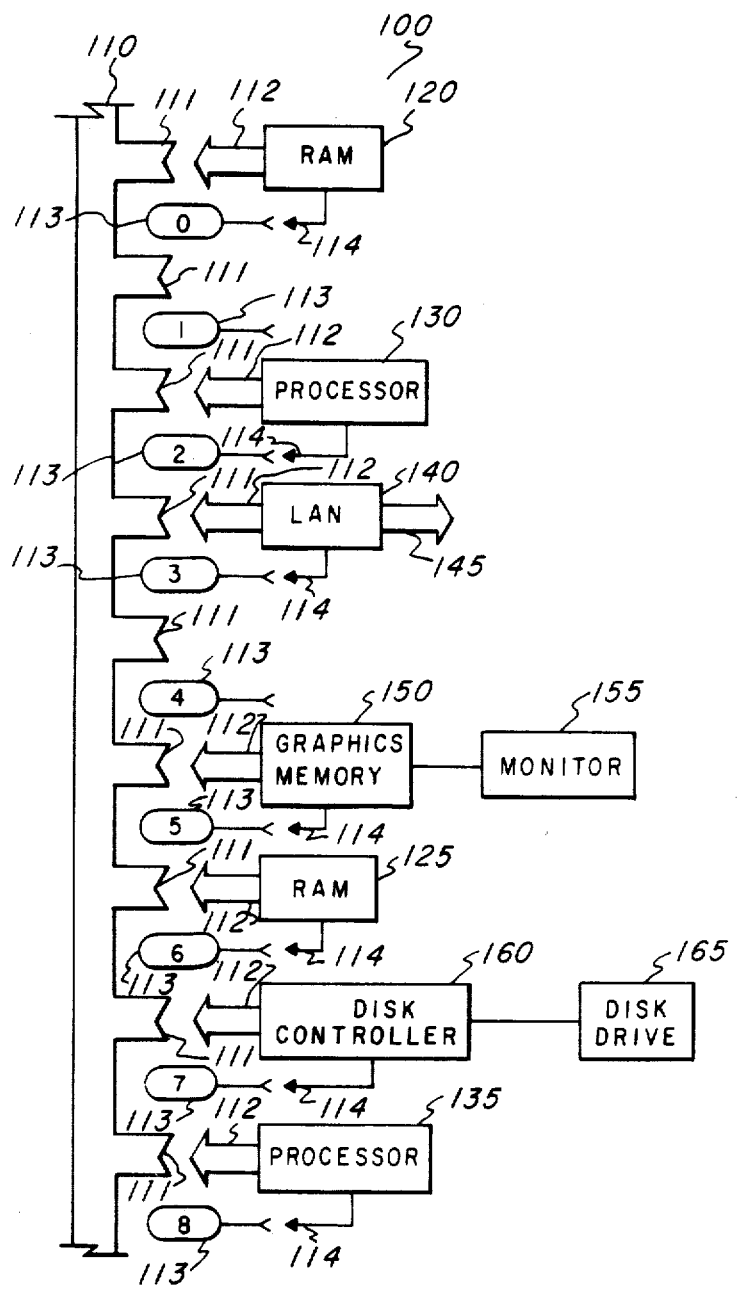
FIG. 1 illustrates a computer system to which the present invention is applicable.

FIG. 1 illustrates data processing system 100 to which the present invention is applicable. Data processing system 100 includes communication bus 110 and various plug-in data processing circuit boards which may be inserted into various slots of communications bus 110. Data processing system 100 includes random access memory circuit 120, processor circuit 130, local area network circuit 145, graphics memory 150, random access memory 125, disk controller 160 and processor 135.

Each slot of communications bus 110 includes a bus connector 111 and a slot number 113. Bus connector 111 mates with a similar connector 112 on each of the data processing circuit boards. This connection allows communication of the signals on bus 110 to and from the particular component entered in that slot. Communications bus 110 further includes slot number connectors 113 which mate with a slot number connector 114 on the circuit board connected to that slot. Note that each slot number connector 113 includes a unique slot number, slot numbers 0 to 8 in the example illustrated in FIG. 1. This permits identification of the particular slot to the circuit board inserted into that slot. Thus, for example, random access memory circuit board 120 may be inserted into any of the nine slots illustrated and the particular slot number connector 111 of that slot will identify to the circuit board the physical location within the set of slots. This unique slot number may be achieved by having a multipin connector from the slot connector 113 to the circuit board via the slot number connector 114. This multibit connector may be tied at the slot connector 113 to either of two logical levels forming a digital number on these lines. Each slot could then be given a different digital number thereby uniquely specifying the particular slot. In the preferred embodiment, a total of four lines are used, allowing a total of 16 different unique slot numbers.

The desired data processing system 100 is assembled by inserting into the slots provided in communications bus 110 the appropriate circuit boards. The data processing system 100 illustrated in FIG. 1 includes random access memory circuit board 120 inserted into slot 0, processor circuit board 130 inserted into slot 2, local area network controller 140 inserted into slot 3, graphics memory 150 inserted into slot 5, random access memory 125 inserted into slot 6, disk controller 160 inserted into slot 7 and processor 135 inserted into slot 8. It should be noted that local area network controller 140 includes a connection 145 to the local area network. Graphics memory 115 is also further connected to a monitor 155 which it controls. Lastly, disk controller 160 is coupled to disk drive 165 which it controls.

In the self test design of data processing system 100, the circuit boards are divided into two categories, intelligent circuit boards, and nonintelligent circuit boards. Each intelligent circuit board must be capable of being the system test master. In order to be a system test master, a circuit board must include a general purpose data processor capable of executing programs communicated to it via the communications bus 110. Each nonintelligent board includes less than this capacity. Processors 130 and 135 each have the capacity to perform their own self tests to be system test master and are intelligent circuit boards.

All other circuit boards in the data processing system 100 are nonintelligent circuit boards. Note that nonintelligent circuit boards may have some but not all of the characteristics of intelligent circuit boards. It is not contemplated that random access memory circuit boards 120 and 125 have self test capability or processing capability. On the other hand, circuits such as local area network controller 140 and disk controller 160 may include a processor and have considerable data processing capability, which may include self test capabilities, but would still be nonintelligent boards. This is because neither of these circuit boards would ordinarily be enabled to perform general purpose data processing based on programs communicated via communications bus 110 and thus could not be a system test master.

Figure 2:
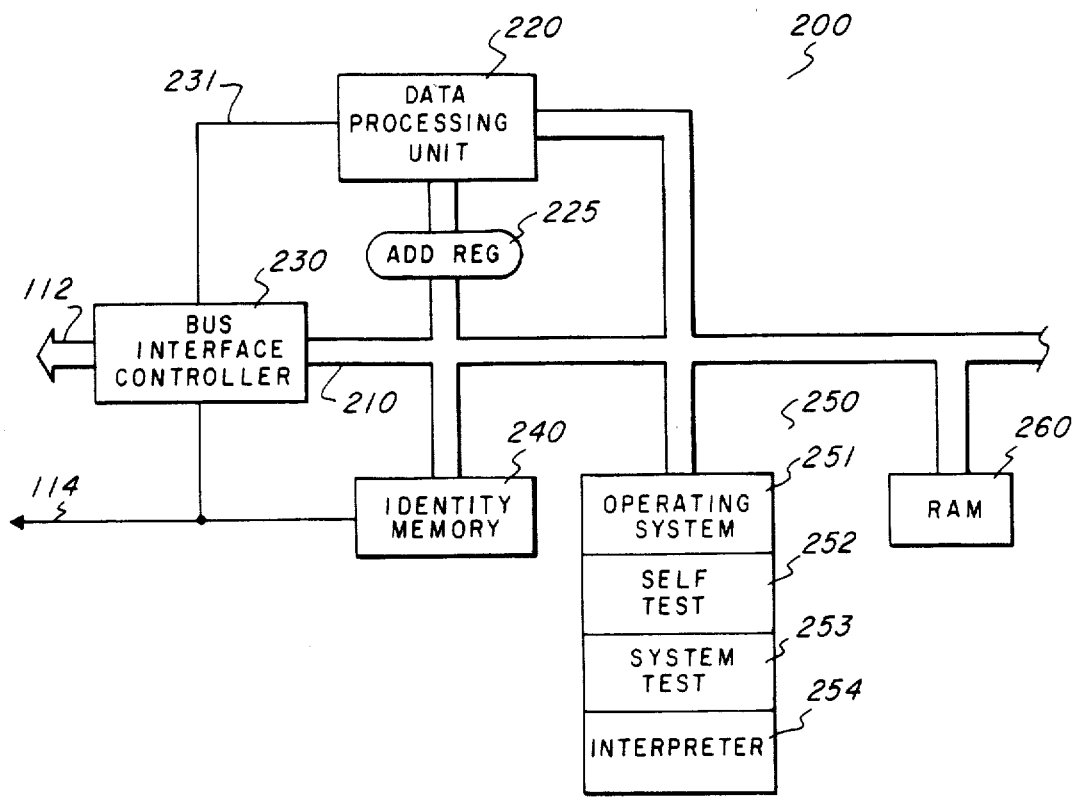
FIG. 2 illustrates the parts of a typical intelligent data processing circuit.

FIG. 2 illustrates processor circuit 200 which is a typical example of an intelligent board used in data processing system 100 illustrated in FIG. 1. Each of processors 130 and 135 would include the general structure illustrated in FIG. 2. Processor circuit 200 includes bus 210, data processing unit 220 with address register 225, bus interface controller 230, identity memory 240, read only memory 250 and random access memory 260. The heart of processor circuit 200 is data processing unit 220, which may be a single chip microprocessor. Data processing unit 220 in conjunction with address register 225 receives data and programs from communications bus 110 via bus controller 230 and manipulates data in conjunction with identity memory 240, read only memory 250 and random access memory 260. The major communication within processor 200 occurs via bus 210. Bus 210 is coupled to address register 225 and to the data input and output portion of data processing unit 220. Data exchange among the various circuits in processor 200 occurs for the most part via bus 210. In general, a program step is entered into data processing unit 220, generally in conjunction with a read memory operation from an address specified by address 225. This instruction causes a data processing operation within data procressing unit 220 which then generates results also on bus 210, for storage within random access memory 260 or identity memory 240 or for transmission to communications bus 110 via bus interface controller 230.

Data processing unit 220 is coupled to communications bus 110 via bus connector 112 and slot number connector 114. Bus interface controller 220 operates under the control of data processing unit 220 via control lines 231. Bus interface controller 230 controls the exchange of data between communications bus 110 and the internal bus 210 within processor 200. On some occasions, bus interface controller 230 is controlled via data processing unit 220 to receive data from communications bus 110. On other occasions data processing unit 220 controls bus interface controller 230 to enable data generated within processor circuit 200 to be transmitted to bus 110. Finally, in other cases, bus interface controller 230 decouples communicatios bus 110 from bus 210 and processor 200 operates internally only.

Figure 3:
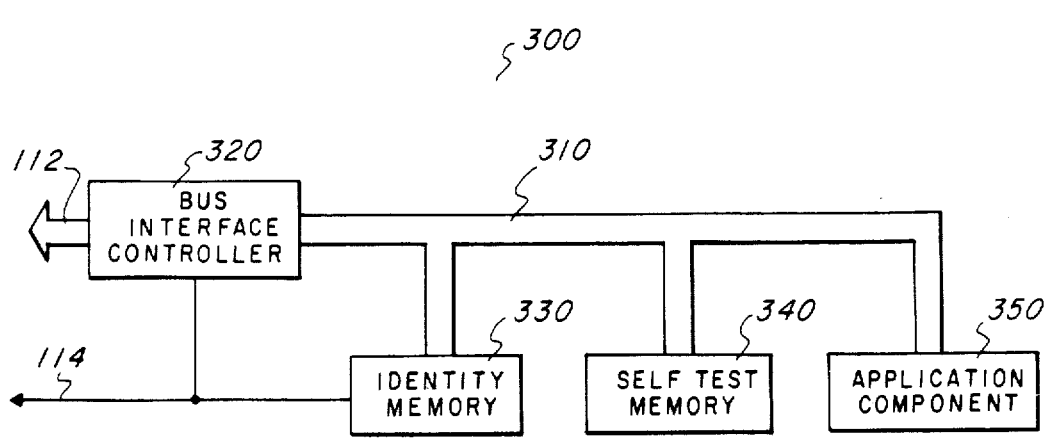
FIG. 3 illustrates the parts of a typical nonintelligent data processing circuit.

An important component of processor 200 is identity memory 240. Identity memory 240 is coupled to the slot connector 113. In accordance with the preferred embodiment, slot connector 113 specifies the most significant bits of the address of identity memory 240. Each identity memory on every circuit board, including both intelligent circuit boards such as illustrated in FIG. 2 and nonintelligent circuit boards such as illustrated in FIG. 3, have the identical least significant bits of their address. Therefore, knowing the slot number of any particular circuit board, it is possible to calculate the starting address of its identity memory. Identity memory 240 is also connected to bus 210 and thereby connected to bus controller 230 and hence to communications bus 110. It is necessary for identity memory 240 to be readable via communications bus 110. The path from communications bus 110 through bus interface controller 220 and bus 210 serves as this link. Any other circuit board in any other slot may read from identity memory 240 by sending a read signal specifying the address having the most significant bits corresponding to the slot and the least significant bits corresponding to the identical start address for each identity memory. The contents of the identity memory are employed in identification of a particular circuit board to other circuit boards via bus 110. The contents of identity memory 240 are further described below in conjunction with FIG. 4.

Read only memory 250 includes several parts which are employed in the self testing data processing system of the present invention. Read only memory 250 includes operating system 251, self test program 252, system test program 253 and interpreter program 254. Operating system 251 includes at least some basic instructions enabling data processing unit 220 to start upon system power up or system reset. These things may include the instructions for controlling bus interface controller 230, the memory locations for identity memory 240 and random access memory 260 and other fundamental features. In addition, operating system 251 may include further sets of instructions for the basic operation of data processing unit 220. Alternately, such other basic instructions may be loaded into random access memory 260 from another circuit board via communication bus 110, bus interface controller 230 and bus 210.

Read only memory 250 further includes self test program 252. Self test program 252 is written to cause data processing unit 220 to exercise all major facilities of processor circuit 200. This may include such things as performing a cyclic redundancy check on a portion or all of read only memory 250 and comparing this with a previously calculated result stored during manufacture within read only memory 250, reading and writing to various memory locations within random access memory 260 and other tasks which exercise the data processing capabilities of circuit 200. Self test program 252 is preferably written in order to exercise the capability of circuit 200 without communication to bus 110 via bus interface controller 230. That is, these tests are preferably strictly local in nature in order to isolate faults within circuit 200. Self test program 252 may be written in the native language of processor 220 for direct execution or may be written in the processor independent test language for execution in conjunction with interpreter program 254 in the manner explained below.

Read only memory further includes system test program 253. System test program 253 includes a program for execution by data processing unit 220 in order to determine which available processor circuit board is to be system test master and then to execute system tests if this board is determined to be the system test master. The operation of system test program 253 is more fully described below in conjunction with program 500 illustrated in FIGS. 5A and 5B. In general, this system test is designed to exercise the major facilities of the entire data processing system 100 in order to isolate and identify any failures within the major systems of data processing system 100.

Read only memory 250 further includes interpreter program 254. Interpreter program 254 is an interpreter for an intermediate level interpretable test language. Interpreter program 254 is used in conjunction with a diagnostic program stored on nonself testing, nonintelligent circuit boards. Interpreter program 254 enables data processing unit 220 to execute the diagnostic program stored on any nonintelligent board which is written in the test language. This test language has been selected to be processor independent, that is it does not depend upon the particular type data processing unit 220 which executes this program. An important feature of the self testing data processing system of this invention is the provision of this interpreter program 254. Interpreter program 254 is written in the native language of data processing unit 220 in accordance with well known principles in order to enable interpretation and execution of the test language which has been selected for the diagnostic programs on the nonintelligent circuit.

Processor circuit 200 further includes random access memory 260. Random access memory 260 provides a portion of read/write memory which data processing unit 220 can use during performance of data processing functions. Although processor circuit 200 can communicate with any random access memory circuit within the data processing system 100 via communications bus 110, it is considered desirable to provide at least a small amount of random access memory on each processor circuit. This enables data processing unit 220 to store blocks of program steps or intermediate data which it can manipulate without requiring it to seek access to communications bus 110 and arbitrate with other circuits for the use of the bus. Thus the provision of at least a small amount of read/write memory such as random access memory 260 on processor circuit 200 could greatly enhance the speed of operation of this circuit.

FIG. 3 illustrates the typical structure of a nonintelligent circuit 300. Nonintelligent circuit 300 includes bus 310, bus interface controller 320, identity memory 330, self test memory 340 and application component 350.

Bus interface controller 320 couples to communications bus 110 via connector 112. Bus interface controller 320 controls the communication between communications bus 110 and bus 310 internal to circuit 300.

Identity memory 330 is coupled to bus 310 and to slot number connector 114. In a manner similar to identity memory 240, identity memory 330 responds to read commands on bus 110 specifying an address having the most significant bits corresponding to the slot connector 113 to which circuit 330 is connected and having the identical least significant bits corresponding to each identity memory. Identity memory 330 includes data identifying the particular circuit board and many of its capabilities. The preferred contents of identity memory 330 is illustrated in FIG. 4.

Circuit 300 further includes self test memory 340. Self test memory 340 includes a diagnostic program which is written in order to exercise the major functions of the circuit 300 including the functions of application component 350. In accordance with the self testing data processing system of the present invention, the diagnostic programs stored within self test memory 340 is written in a processor independent test language. This test language is preferably an intermediate level interpretable language such as Forth. As noted in conjunction with FIG. 2, each intelligent data processing circuit 200 includes an interpreter program for interpreting this test language. In the preferred embodiment the interpreter program 254 includes a kernel of primitive functions in this interpretable test language. The diagnostic programs stored within self test memory 340 utilizes this kernel of primitives in order to define additional operations which are ultimately used to test the major functions of the circuit.

Application component 350 is the major useful portion of nonintelligent circuit board 300. It may be any circuit that is useful to data processing system 100. Random access memory circuit boards 120 and 125 include random access memory as their application component. Local area network controller 140 and disk controller 160 have application components which communicate with and control other circuits useful to data processing system 100. Similarly, graphics memory 150 has as its application component memory for storing the contents of a graphics display and control circuits for causing monitor 155 to generate that display.

Figure 4:
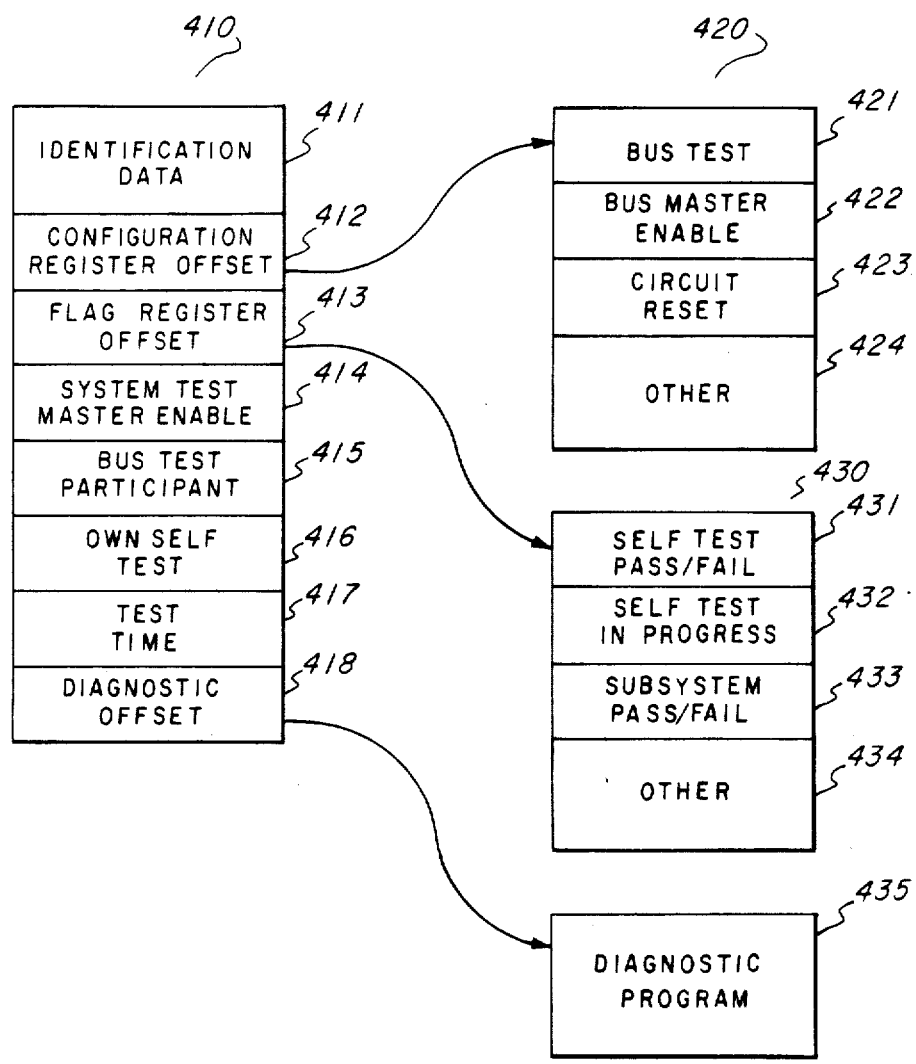
FIG. 4 illustrates the contents of the identity memory in accordance with the present invention.

FIG. 4 illustrates the contents of a typical identity memory such as is included in each circuit within data processing system 100. Each such identity memory is arranged in this fashion. However, each identity memory may not include all of the parts illustrated in FIG. 4.

Identity memory includes a first part 410 which is located at the base address of the identity memory. This base address is calculated from a fixed set of least significant bits which is common to each identity memory and a set of most significant bits which is dependent upon the slot number. Therefore, the beginning of the data within identity memory 410 is at an address which is readily calculatable for each of the slots in communication bus 110. This first part of identity memory 410 includes identification data 411, configuration register offset 412, flag register offset 413, system test master enable flag 414, bus test participant flag 415, own self test flag 416, test time data 417 and diagnostic offset 418.

The identification data 411 for each identity memory includes information which specifically identifies the particular circuit board. This may include the part number and serial number of the circuit, the revision level, the circuit type, the circuit vendor and other such identification data. This data will permit system configuration dynamically upon power up thereby enabling any circuit to be placed in any slot. Identification data 411 may also include some error checking codes which enable a reading device to determine whether or not it has properly read the identification memory by a cyclic redundancy check with this error checking code. This identification data may also include data on the length of the identity memory because differing circuits may have differing identity memory lengths.

The configuration register offset 412 is a pointer to another location within the identification memory called the configuration register. The configuration register offset 412 is preferably the distance from the identity memory base address to the start of the configuration register. The configuration register. The configuration register offset 412 is preferably the distance from the identity memory base address to the start of the configuration register. The configuration register 420 includes bus test flag 421, bus master enable flag 422, circuit reset flag 424 and other data 424. The bus test flag 421 indicates whether or not the circuit board is performing a bus test on communications bus 110. This is preferably a single bit set by the system test master and reset by the circuit board when the bus test is completed. The bus master enable flag 422 indicates whether or not this circuit is permitted to request bus master status. This request must be made in order to participate in the arbitration for control of communications bus 110. This is preferably a single bit which is set if the circuit is enabled by the system to be a bus master and reset if the circuit board is disabled as a master. Circuit reset flag 423 is preferably controlled by the communication bus 110 to control whether the circuit board performs a reset function. This is preferably a single bit which if set causes the circuit board to restart its functions and otherwise permits normal operation. Configuration register 420 also includes other data 424 which includes additional data on the type of circuit board. This may include starting addresses for particular functions and other similar data.

Flag register offset 413 is similar to configuration register offset 412. Flag register offset 413 includes the data for calculating the start address of flag register 430. This calculation is made from the start address of identity memory 410 and the data within flag register offset 413.

Flag register 430 includes self test pass/fail flag 431, self test in progress flag 432, subsystem pass/fail flag 433 and other data 434. Self test pass/fail flag 431 is preferably a single bit which indicates whether the system has passed or failed its own circuit test. This single bit is preferably set if the circuit board has failed its self test and a reset if the circuit board has passed its circuit test. Self test in progress flag 432 is preferably a single bit which indicates whether or not the circuit self test is in progress. This single bit is preferably set if the self test is in progress and reset if the self test is complete. Subsystem pass/fail flag 433 is preferably a single bit which indicates whether a subsystem which is controlled by the circuit board has passed or failed a subsystem test. This data is useful in the case of disk controller 160 and disk drive 165, for example. Disk controller 160 is coupled directly to communications bus 110 and thus may indicate to communications bus 110 whether or not disk drive 165, which is controlled by disk controller 160, has passed or failed a subsystem test. This bit is preferably set if the subsystem has failed and reset if the subsystem has passed. Other data 434 may be employed to communicate other conditions of the circuit.

System test master enable flag 414 is preferably a single bit which indicates whether or not the circuit can become the system test master. This bit is preferably set if the board can become the system test master and reset if it cannot become system test master.

Own self test flag 416 indicates whether or not this particular circuit can perform its own circuit test. This is preferably a single bit which is set if the circuit can perform its own circuit test and reset if the circuit board cannot perform its own self test.

Test time data 417 indicates the length of time required for the circuit to perform its own circuit test. In the event that the circuit can perform its own self test, then test time data 417 indicates the length of time the present circuit requires to perform its own circuit self test. This data is employed by other intelligent data processing circuits in order to determine whether or not the present circuit has taken too great a time to complete its circuit self test. This test time data 417 is preferably one byte of memory which indicates the base two logarithm of the test duration in seconds. The test duration indicated by test time data 417 is preferably the upper bound of test time required for the particular circuit to perform its own self test.

Diagnostic offset 418 is a memory pointer which indicates the beginning of diagnostic program 440. This is preferably data which indicates the distance in address from the base address of identity memory 410 to the beginning of the diagnostic program 440. This address is most important in the case of a nonintelligent data processing circuit which cannot perform its own circuit self test. This offset enables another data processing circuit to determine the beginning of the diagnostic program from communications bus 110. This determination of the beginning of diagnostic program 440 then permits an intelligent data processing circuit to recall, interpret and execute the diagnostic program thereby testing the circuit in question. In the case of an intelligent board this diagnostic offset 418 may point to self test program 252 within read only memory 250. In the case of a nonintelligent board, diagnostic offset 418 points to the beginning of self test memory 340 where the diagnostic program is stored.

Figure 5A:
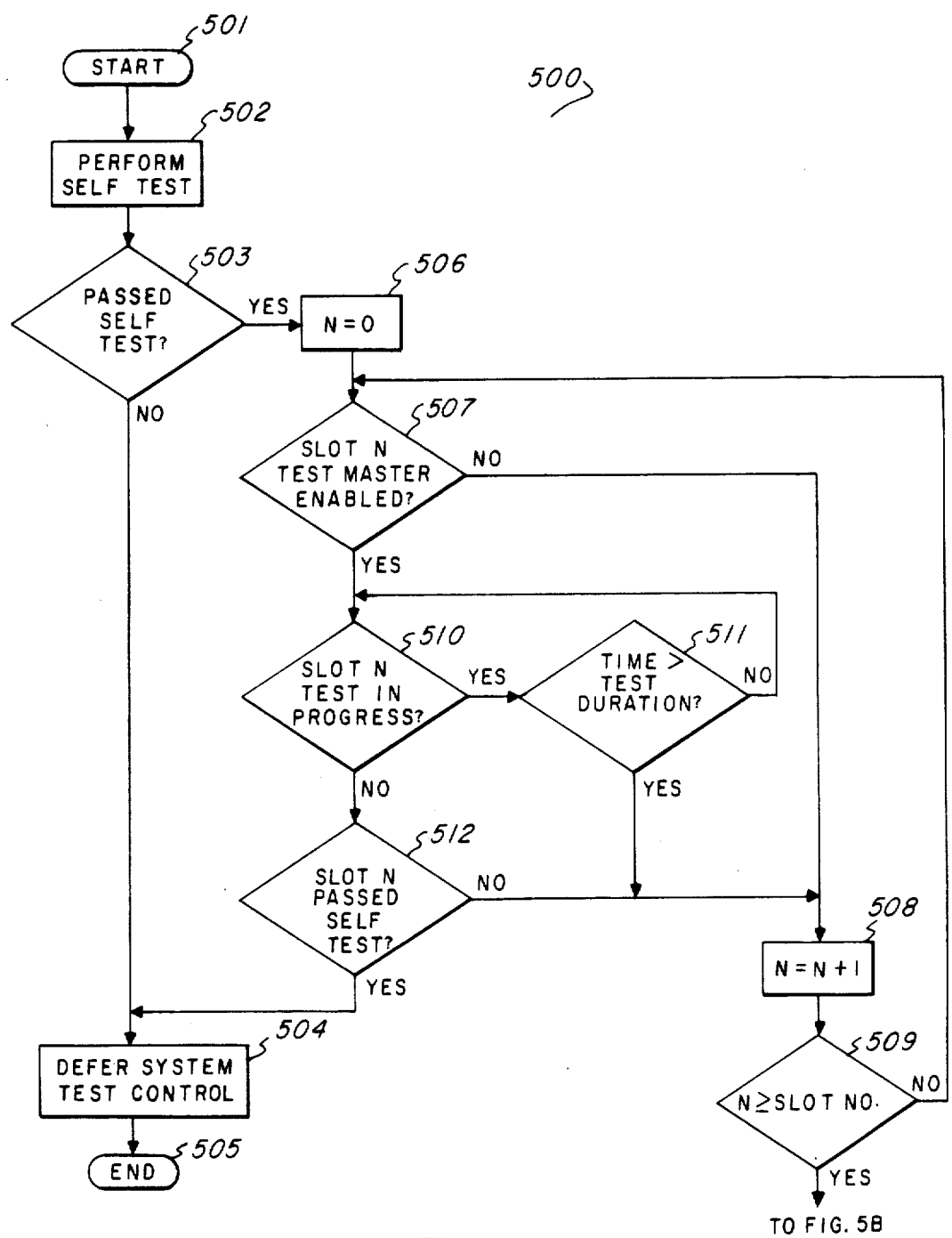
FIG. 5a and 5b illustrate a flow chart of the program of each intelligent data processing circuit in accordance with the present invention.
Figure 5B:
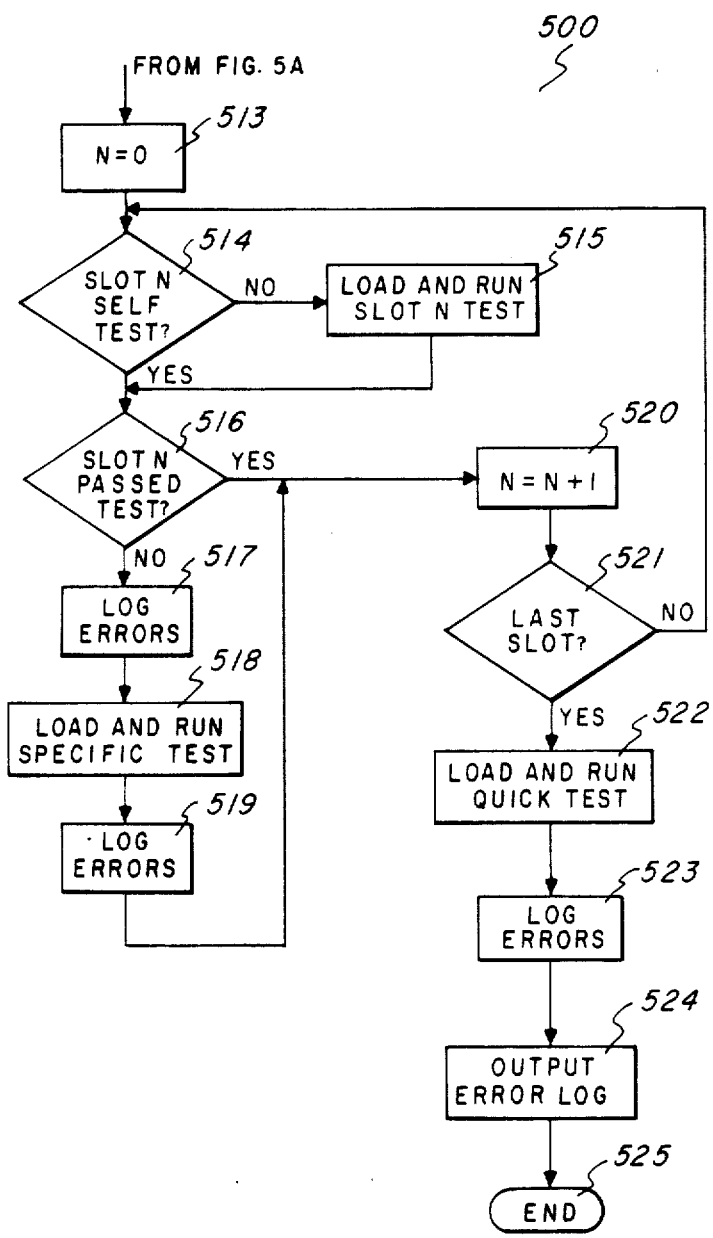

FIGS. 5A and 5B illustrate program 500 which is executed by each intelligent data processing circuit within data processing system 100. Program 500 is included in system test program 253 illustrated in FIG. 2. Program 500 includes the functions of circuit self test, system test master arbitration and system test control.

Program 500 is begun at start block 501. Program 500 first performs the circuit self test within the intelligent data processing circuit. This is performed by execution of the program stored in self test memory 252 illustrated in FIG. 2. This circuit self test may be written in the native language of data processing unit 220 on that intelligent data processing circuit board. In the alternative, this self test program may be written in the intermediate level interpretable test language and interpreted via the interpreter program 254. In either event, the major functions of the intelligent data processing circuit board are tested under program control of data processing unit 220. Processing block 502 includes setting self test in progress flag 432 to indicate that the circuit self test is in progress, executing self test program 252, resetting self test in progress flag 432 to indicate the self test is complete and setting or resetting self test pass/fail flag 431 as necessary to indicate the result.

Program 500 then tests to determine whether or not the intelligent data processing circuit board has passed its own circuit self test (decision block 503). In the event that the intelligent data processing circuit board has not passed its own self test, then this circuit board cannot be the system test master. In such an event program 500 defers system test control (processing block 504) and program 500 is terminated (end block 505).

If the circuit board has passed its own circuit test then it is a candidate for system test master. A loop variable N is then set to zero (processing block 506). Program 500 now tests slot N to determine whether or not it can be a system test master (decision block 507). This test is achieved by having the present circuit generate a read memory signal specifying the address of the system test master enable flag 414 of identity memory 410. As will be recalled, the start address of identity memory 410 is identical for each circuit board with the exception of the most significant bits being determined by the particular slot. Knowing the slot to be accessed thus permits the intelligent data processing circuit board to determine the address of system test master enable flag 414 and thereby read from this memory.

In the event that slot N is not enabled as a system test master, then the loop variable is incremented (processing block 508). Program 500 then tests to determine whether or not the loop variable is greater than or equal to the slot number of the current circuit (decision block 509). If the loop variable N is not greater than or equal to the slot number of the present circuit board, then flow returns to decision block 507 to determine whether the next slot is master enabled.

In the event that it is determined that a particular slot can be the system test master, then program 500 tests to determine whether or not the test program of this slot is in progress (decision block 510). This test is achieved by reading the self test in progress flag 432 from flag register 430. The location of flag register offset 413 is fixed once the slot number and the corresponding most significant bits of the address have been selected. Using the information in flag register offset 413, it is possible to calculate the address of self test in progress flag 432 thus the intelligent data processing circuit can generate a read memory signal to read the data in self test in progress flag 432. If this self test is in progress, then program 500 has to determine whether the total time elapsed since the beginning of program 500 exceeds the test duration indicated by test time date 417 (decision block 511). The test duration data may be recalled from test time memory 417 of identity memory 410. If this test time has not been exceeded, then program 500 returns to decision block 510 to again test whether or not the self test of that particular slot is in progress. Program 500 remains in this loop until either the test is completed or the time exceeds the test duration. In the event the time exceeds the test duration, then program 500 proceeds to processing block 508 to increment the loop variable. This is the same as assuming that the slot has failed its circuit test. This time out provision prevents the system from being locked up if an intelligent data processing circuit board fails in a manner which always indicates circuit self test in progress. If the circuit in this slot has circuit self test in progress longer than the predetermined test duration stored in its identity memory, then the other intelligent data processing circuits assume that the circuit in this slot has failed.

It should be noted that it is not necessary for program 500 to remain in the loop including decision blocks 510 and 511 while waiting for the circuit self test to complete or for time out. It would be equally possible for program 500 to go on to test other slot numbers, returning periodically to test that particular slot number. That particular slot would be tested to determine whether or not its circuit self test continues to be in progress and whether or not the time in which this circuit self test has been in progress exceeds the test duration for that circuit board. This alternative system has the advantage that the intelligent data processing circuit board is not tied up in a relatively useless loop during the time it is waiting either for the circuit self test to complete or for time out.

In the event that a system test master enabled circuit board has completed its circuit self test, program 500 then tests to determine whether or not the circuit board in this slot has passed its self test (decision block 512). This is achieved by reading self test pass/fail flag 431 from the flag register 430. In the event that this slot has passed its own circuit self test, then the current circuit board defers system test control (processing block 504) and stops program 500 (end block 505). This is in accordance with the arbitration procedure for determining the system test master. The intelligent data processing circuit board which has passsed its circuit self test and which occupies the lowest slot number is the system test master. Thus, any intelligent data processing circuit board which determines that an intelligent data processing circuit in a lower slot number has met these conditions must defer taking system test control. In the event that this slot has not passed its circuit self test, then program 500 increments the loop variable (processing block 508) and the loop is repeated if necessary.

In the event that program 500 determines that the variable N is greater than or equal to the current slot number (decision) block 509) then this circuit board is system test master. This is because the program has not detected any other intelligent data processing circuit which has passed its own circuit self test and which occupies a lower slot number.

Upon this determination, the loop variable is again set to zero (processing block 513). Program 500 then tests to determine whether slot N performs its own self test (decision block 514). In the event that this slot number does not perform its own self test, then program 500 loads and runs the self test for this slot number N (processing block 515). This is achieved by calculating the beginning address of the diagnostic program 400 from the diagnostic offset 418. The diagnostic program 440 is written in the test language. It is executed by recall from the nontesting circuit board, interpretation via interpreter program 254 and execution of these tests. This will require communication between the nonself testing circuit and the system test master circuit via communicatins bus 110. This diagnostic program must be written to exercise the major facilities of the nonself testing circuit. Program 500 then tests to determine whether the circuit in this slot has passed its circuit test (decision block 516), whether this has been its own circuit self test or a diagnostic program 440 executed by the system test master.

In the event that the circuit board in slot N has failed its circuit test, then program 500 logs the errors observed (processing block 517). Next a specific test program corresponding to those errors is loaded and run (processing block 518). This is most often a longer and more detailed test which may be stored in disk drive 165 and recalled via communication with disk controller 160. This specific test program is preferably also written in the test language. This is preferable because then each processor within the data processing system can execute this specific test program via its own interpreter program 254. This specific test program is designed to more fully utilize the capabilities of the circuit under test and to more particularly isolate the failing subsystem. These errors are then logged (processing block 519).

In the event that a slot has passed its circuit test or a specific test has been run and those errors logged, program 500 then increments the loop variable (processing block 520). Next program 500 tests to determine whether the last slot has been considered (decision block 521). If the last slot has not been considered then flow returns to decision block 514. Thus, program 500 continues in this loop until each slot has been considered. Note that it is not necessary to consider any special case for the slot of the system test master. This is because it will have been previously determined that the intelligent data processing circuit executing program 500 has passed its own circuit self test and therefore decision block 516 will continue the loop.

Once the last slot has been tested, then program 500 loads and runs a quick test of the system (processing block 522). This quick test will ordinarily requires each slot in turn to write some data to a known good memory location and then recall it for comparison. This quick test will enable the system test master to determine whether or not the communicatins bus is working adequately for all slots. Program 500 then logs any errors found in this quick test (processing block 523). Program 500 then outputs any errors appearing in the error log (processing block 524). These errors may have been previously logged in processing blocks 517 or 519 or may be errors determined during the quick test and logged in processing block 523. At this point program 500 is terminated via exit block 525.

We claim:

1. A self testing data processing system comprising:

a communications bus having a plurality of connection slots, each connection slot having a unique electrically readable slot number, said communicatins bus for bidirectional communicatins between said slots;
a plurality of intelligent data processing circuits, each intelligent data processing circuit connected to one of said slots and having an identity memory means and a testing means, said identity memory means having identity data indicating said intelligent data processing circuit can be a system test master and self test data indicating whether or not said intelligent data processing circuit has passed a circuit self test, said testing means including at least one processor means for performing general data processing tasks under program control, and having a circuit testing means coupled to the identity memory means for self testing said intelligent data processing circuit and loading data into said identity memory means indicative of whether or not said intelligent data processing circuit has passed said circuit self test, a master arbitration means coupled to said communications bus for reading said identity memory means of other slots and deferring system test control if said intelligent data processing circuit has failed its circuit self test or if said identity memory means of any lower slot number has identity data indicating it can be a system test master and self test data indicating it has passed its circuit self test, and system test master means coupled to said communications bus for controlling system test if system test control is not deferred.

2. A self testing data processing system as claimed in claim 1, wherein:
each intelligent data processing circuit includes means for electrically reading said unique slot number and means for generating data on said communication bus from said identity memory means in response to a read memory signal on said communicatins bus specifying an address which bears a predetermined relationship to said slot number, and wherein said master arbitration means includes means for reading said identity memory means of another slot by generating on said communications bus a read memory signal specifying an address which bears said predetermined relationship to said slot number.

3. A self testing data processing system as claimed in claim 2, wherein:
said predetermined relationship of slot number to identity memory means address having the same least significant bits for each identity memory means and having the most significant bits determined by said slot number.

4. A self testing data processing system as claimed in claim 1, wherein:
said identity memory means of each intelligent data processing circuit has further self test data indicating whether or not circuit self test is in progress; and
said master arbitration means of each intelligent data processing circuit determines that an intelligent data processing circuit in another slot has failed its circuit self test if the self test data for that slot indicates circuit self test in progress for longer than a predetermined period of time.

5. A self testing data processing system as claimed in claim 4, wherein:
said identity memory means of each intelligent data processing circuit further has test duration data indicating the test duration required to perform its circuit self test; and
said master arbitration means of each intelligent data processing circuit further reads said test duration data for an intelligent data processing circuit in another slot, and further sets said predetermined period of time to be not less than said test duration.

6. A self testing data processing system as claimed in claim 1, wherein:
said testing means of each intelligent data processing circuit is actuated upon initial application of electric power.

7. A self testing data processing system as claimed in claim 1, wherein:
said testing means of each intelligent data processing circuit is actuated via a system reset command on said communications bus.

8. A self testing data processing system as claimed in claim 1, further comprising:
at least one nonintelligent data processing circuit, each nonintelligent data processing circuit connected to one of said slots and having an identity memory means readable from said communications bus, said identity memory means having identity data indicating said nonintelligent data processing circuit cannot be a system test master; and
wherein said system test master means of each intelligent data processing circuit further includes means for testing said nonintelligent data processing circuits if system test control is not deferred.

9. A self testing data processing system as claimed in claim 8, wherein:
each nonintelligent data processing circuit includes means for electrically reading said unique slot number and means for generating data on said communications bus from said identity memory means in response to a read memory signal on said communications bus specifying an address which bears a predetermned relationship to said unique slot number.

10. A self testing data processing system as claimed in claim 9, wherein:
said predetermined relationship of slot number to identity memory address having the same least significant bits for each identity memory means and having the most significant bits determined by said unique slot number.

11. An intelligent data processing circuit comprising:
a bus connector means for connection to a communication bus for bidirectional communication, said bus connector means having slot number reading means for reading an electrically readable slot number from said communications bus;
an identity memory means connected to said bus connector means for generating data on said communications bus in response to a read signal specifying an address which bears a predetermined relationship to said slot number, said data including identity data indicating that said intelligent data processing circuit can be a system test master and self test data indicating whether or not said intelligent data processing circuit has passed a circuit self test; and
a testing means connected to said bus connector means for bidirectional communication with said communication bus, said testing means having at least one processor means for performing general purpose data processing tasks under program control, and including circuit testing means coupled to said identity memory means for self testing said intelligent data processing circuit and loading data into said identity memory means indicating whether or not said intelligent data processing circuit passed said circuit self test, master arbitration means coupled to said communications bus for generating on said communications bus read signals specifying addresses which bear said predetermined relationship to other slot numbers treating any response from said communications bus as identity data and self test data and deferring system test control if said intelligent data processing circuit has failed its circuit self test or if any lower slot number has identity data indicating it can be a system master and self test data indicating it can be a system master and self test data indicating it has passed its circuit self test, and a system test master means coupled to said communications bus for controlling system test via said communications bus if system test control is not deferred.

12. An intelligent data processing circuit as claimed in claim 11, wherein:
said predetermined relationship of slot number to identity memory means address having fixed least significant bits and having the most significant bits determined by said slot number.

13. An intelligent data processing circuit as claimed in claim 11, wherein:
said identity memory means has further self test data indicating whether or not a circuit self test is in progress; and
said master arbitration means determines that an intelligent data processing circuit in another slot has failed its circuit self test if the self test data for that slot indicates circuit self test in progress for longer than a predetermined period of time.

14. An intelligent data processing circuit as claimed in claim 11, wherein:
said identity memory means further has test duration data indicating the test duration required to perform its circuit self test; and
said master arbitration means reads said test duration data for an intelligent data processing in another slot, and further sets said predetermined period of time to be not less than said test duration.

15. An intelligent data processing circuit as claimed in claim 11, wherein:
said testing means is actuated upon initial application of electric power.

16. An intelligent data processing circuit as claimed in claim 11, wherein:
said testing means is actuated via a system reset command on said communications bus.

17. A self testing data processing system comprising:
a communications bus having a plurality of connection slots, each connection slot having a unique electrically readable slot number, said communications bus for bidirectional communications between said slots; and
a plurality of intelligent data processing circuits, each intelligent data processing circuit connected to one of said slots and having an identity memory means and a testing means, said identity memory means having identity data indicating said intelligent data processing circuit can be a system test master, said testing means including at least one processor means for performing general purpose data processing tasks under program control and having a master arbitration means coupled to said communications bus for reading said identity memory means of other slots and deferring system test control if said identity memory means of any lower slot number has identity data indicating it can be a system test master, and system test master means coupled to said communications bus for controlling system test if system test control is not deferred.

18. An intelligent data processing circuit comprising:
a bus connector means for connection to a communicaton bus for bidirectional communication, said bus connector means having slot number reading means for reading an electrically readable slot number from said communications bus; and
an identity memory means connected to said bus connector means for generating data on said communications bus in response to a read signal specifying an address which bears a predetermined relationship to said slot number, said data including identity data indicating that said intelligent data processing circuit can be a system test master; and
a testing means connected to said bus connector means for bidirectional communication with said communication bus, including at least one processor means for performing general purpose data processing tasks under program control, and including master arbitration means coupled to said communications bus for generating on said communications bus read signals specifying addresses which bear predetermined relationship to other slot numbers treating any response from said communications bus as identity data and deferring system test control if any lower slot number has identity data indicating it can be system master, and a system test master means coupled to said communications bus for controlling system test via said communications bus if system test control is not deferred.

19. A computer system having a distributed self-test mechanism, comprising:
a system bus having a plurality of slots for receiving circuit modules;
at least one circuit module located in a slot which does not have the capability for self test; and
at least two circuit modules which are capable of self test, and which further are capable of performing a system test, including the testing of said at least one circuit module which does not have the capability for self test;
wherein said at least two circuit modules which are capable of self test each perform their individual self tests, and those which pass their self test then arbitrate among themselves to determine which circuit module will perform the system test, whereby the circuit module so selected performs the system test.

20. The system of claim 19, wherein all of said at least one circuit module which does not have the capability for self test and said at least two circuit modules which are capable of self test are assigned a number according to which the slots in said system bus they reside, and wherein the arbitration between said at least two circuit modules which are capable of self test selects the circuit module to perform the system test based on the slot numbers thereof.

21. The system of claim 20, wherein the circuit module having the lowest assigned slot number is selected to perform the system test.

* * * * *